(12) United States Patent
Henstra

(10) Patent No.: US 7,378,667 B2
(45) Date of Patent: May 27, 2008

(54) PARTICLE-OPTICAL APPLIANCE PROVIDED WITH ABERRATION-CORRECTING MEANS

(75) Inventor: Alexander Henstra, Eindhoven (NL)

(73) Assignee: FEI Company, Hillsboro, OR (US)

( * ) Notice: Subject to any disclaimer, the term of this patent is extended or adjusted under 35 U.S.C. 154(b) by 261 days.

(21) Appl. No.: 11/397,480

(22) Filed: Apr. 4, 2006

(65) Prior Publication Data

US 2006/0219935 A1    Oct. 5, 2006

(30) Foreign Application Priority Data

Apr. 5, 2005  (NL) .................................. 1028699
May 18, 2005  (NL) .................................. 1029066

(51) Int. Cl.
*G21K 1/00* (2006.01)
(52) U.S. Cl. .................... 250/396 R; 250/396 ML; 250/397; 250/398
(58) Field of Classification Search ............ 250/396 R, 250/396 ML, 397, 398
See application file for complete search history.

(56) References Cited

U.S. PATENT DOCUMENTS 2,919,381 A    12/1959  Glaser

| | | |
|---|---|---|
| 6,888,145 B2 | 5/2005 | Muller et al. |
| 7,012,262 B2 * | 3/2006 | Rose ................. 250/396 ML |
| 2004/0004192 A1 * | 1/2004 | Krivanek et al. ....... 250/396 R |

OTHER PUBLICATIONS

H. Koops, "Aberration Correction in Electron Microscopy," The Instrument Today and Tomorrow, Ninth International Congress on Electron Microscopy, Toronto, p. 185-196, date unavailable.
M. Haider, S. Uhlemann, J. Zach, "Upper Limits for the Residual Aberrations of a High-Resolution Aberration-Corrected Stem," Ultramicroscopy 81 (2000), p. 163-175.

* cited by examiner

*Primary Examiner*—Jack I. Berman
*Assistant Examiner*—Michael Maskell
(74) *Attorney, Agent, or Firm*—Scheinberg & Griner, LLP; Michael O. Scheinberg

(57) ABSTRACT

Quadrupole-octupole aberration corrector for application in a TEM, STEM or SEM. A known corrector for correcting third-order and fifth-order aberrations of the objective is embodied with eight quadrupoles and three octupoles. The corrector according to the invention has at least the same aberration-correcting power, but, according to the invention, is embodied with six quadrupoles and three octupoles. By adding octupoles with a relatively weak excitation to a portion of the quadrupoles, correction of the anisotropic coma of the objective lens is also attained. By embodying all quadrupoles, or a portion thereof, to be electromagnetic, chromatic aberrations can also be corrected for.

25 Claims, 8 Drawing Sheets

PARTICLE-OPTICAL APPLIANCE PROVIDED WITH ABERRATION-CORRECTING MEANS

The invention relates to a particle-optical appliance provided with an objective lens and with aberration-correcting means for correcting lens errors of the objective lens, which aberration-correcting means consists of:
- a first group of optical elements, consecutively consisting of a first, a second and a third quadrupole lens and a first octupole;
- a second group of optical elements, consecutively consisting of a second octupole and a fourth, a fifth and a sixth quadrupole lens; and
- at least one third octupole, placed outside both groups of optical elements,
- whereby the first and the second octupole and the third and the fourth quadrupole lens are placed between the first and the second quadrupole on the one hand and the fifth and the sixth quadrupole on the other hand, in which the quadrupole lenses determine the paths of electrically charged particles in the aberration-correcting means in such a manner as to cause imaging of octupoles upon one another.

Such an appliance is known from US patent application No. US 2004/0004192 A1. The aberration-correcting means (aberration corrector) described in this document comprise a first group of optical elements and a second group of optical elements. In the direction of ray propagation (see the reference numerals in the cited US document), the first group of optical elements consecutively consists of two quadrupoles 51 and 52, a combination of a quadrupole and an octupole 61, and a quadrupole 53. In the direction of ray propagation, the second group of optical elements consecutively consists of a quadrupole 55, a combination of a quadrupole and an octupole 62, and two quadrupoles 56 and 57. A further octupole 64 can be placed prior to the above-mentioned elements; alternatively, this octupole 64 can be omitted and an octupole 63 can be placed behind the above-mentioned elements. In total, this known aberration corrector thus consists of eight quadrupoles and three octupoles.

Using the aberration corrector described in the cited US document, it is possible to completely correct the third-order spherical aberration of the objective lens, and also to correct all fifth-order geometric image errors. Moreover, the cited US document sets forth that it is possible to additionally correct the axial chromatic aberration of first order.

The invention aims to provide a particle-optical appliance provided with an aberration corrector made up of quadrupoles and octupoles, which aberration corrector has a simpler construction than the aberration corrector described in the cited US patent document, whereby at least the same aberration-correcting power is maintained.

To this end, the particle-optical appliance according to the invention is characterized in that:
- in a first axial plane, the first and the second octupole are not imaged upon one another, and the second and the third octupole are imaged upon one another;
- in a second axial plane perpendicular to the first axial plane, the first and the second octupole are not imaged upon one another, and the first and the third octupole are imaged upon one another; and
- an axial beam in the first axial plane passes through the axial point of the first octupole and in the second axial plane passes through the axial point of the second octupole, as a result of which third-order lens errors of the objective lens are corrected, and fifth-order lens errors of the objective lens are, at the least, minimized.

The cited US document sets forth that all octupoles must be imaged upon one another, both in the x-z plane and in the y-z plane. The invention is based upon the insight that this is an overly stringent demand, which can be softened. Softening said overly stringent demand is made possible by the fact that an axial ray in the first axial plane is sent through the axial point of the first octupole and in the second axial plane is sent through the axial point of the second octupole. Put another way: with the aid of quadrupoles, a first line focus is formed in the first octupole and a second line focus—perpendicular to the first one—is formed in the second octupole. The softened demand now requires that, in a first axial plane, the first and the second octupole are not imaged upon one another and the second and the third octupole are imaged upon one another, and, in a second axial plane perpendicular to the first axial plane, the first and the second octupole are not imaged upon one another, and the first and the third octupole are imaged upon one another. By somewhat softening said overly stringent demand in this manner, full correction of said aberrations of the objective can still occur, as a result of which, in the aberration corrector according to the invention, one can suffice with just six quadrupoles instead of eight. In this manner, not only are construction costs of the corrector reduced, but the dimensions thereof can also reduce, and, as a result of the smaller number of components, the excitation adjustment and the alignment within the particle-optical appliance also become less complicated.

In an embodiment of the particle-optical appliance according to the invention, the quadrupole field of the third quadrupole lens and the octupole field of the first octupole overlap one another at least partially, and the quadrupole field of the fourth quadrupole lens and the octupole field of the second octupole overlap one another at least partially. In this manner, it is possible to embody said quadrupoles and octupoles as one physical whole, as a result of which, in the case of a magnetic multipole, for example, a single iron circuit will suffice, as will a single electrical power supply unit. Moreover, as a result of the spatial coincidence of said quadrupoles and octupoles, space is saved, as a consequence of which the construction of the particle-optical apparatus can be more compact.

In another embodiment of the particle-optical appliance according to the invention, the third octupole is located at that side of the aberration-correcting means at which the objective lens that is to be corrected in the particle-optical appliance is not located. So as to achieve an optimal correction, it is generally desirable in the case of quadrupole-octupole correctors that the third octupole be imaged onto the coma-free plane of the objective to be corrected. Now, if the third octupole is located at that side of the corrector at which the objective lens is located, then a transfer lens will be necessary between this octupole and the objective, so as to achieve the image referred to. However, if the third octupole is located at that side of the corrector at which the objective lens that is to be corrected in the particle-optical appliance is not located, then the objective can be placed at the other side of the corrector, and a transfer lens is thus unnecessary.

In yet another embodiment of the particle-optical appliance according to the invention, the third octupole is divided into a first portion and an equal second portion by a cross-section perpendicular to the optical axis, which portions are respectively located on opposite sides of both groups of optical elements, and a plane of mirror symmetry perpendicular to the optical axis is present in such a manner that, when mirrored with respect to said symmetry plane, the positions of the three quadrupoles and the octupole of the first group, and the first portion of the third octupole, yield the locations of the three quadrupoles and the octupole of the second group, and of the second portion of the third octupole, whereby the excitations of the quadrupoles of the first group are opposite to those of the corresponding quadrupoles of the second group. With the aid of these measures, a number of lens errors of the fifth order are corrected. These fifth-order lens errors can be represented in a manner known per se, according to a systematic classification; see, in this context, the article by M. Haider et al. in Ultramicroscopy 81, (2000), pp. 163-175. In this classification, all axial geometric lens errors of the third and the fifth order are divided into various groups, in which the coefficients are indicated by the letters A, C, D and S. The coefficients are further provided with an index that indicates the order of the relevant lens error. For example, in this classification system, the generally known coefficient of the third-order spherical aberration is indicated by $C_3$. The coefficients of the lens errors that are corrected using the above-mentioned measures are indicated in said classification by $A_5$ and $S_5$; they can be respectively described as the fifth-order aberration with six-fold symmetry and the fifth-order aberration with two-fold symmetry. In this manner, these lens errors are therefore all made equal to zero.

In yet another embodiment of the particle-optical appliance according to the invention, the third and the forth quadrupole lens are each embodied as a combination of magnetostatic and electrostatic quadrupoles. By employing these measures, one achieves a situation whereby the axial chromatic lens error of the first order and the first degree (i.e. the chromatic lens error that is proportional to $(\Delta U/U)^1$, in which U is the acceleration voltage of the charged particles) is made equal to zero, and whereby non-axial chromatic lens errors are made relatively small. An axial lens error should be interpreted as being a lens error whose magnitude does not demonstrate a proportionality to the distance to the optical axis. (An example of an axial lens error is the previously mentioned third-order spherical aberration with coefficient $C_3$; an example of a non-axial lens error is the third-order coma, whose magnitude is proportional to the distance r to the optical axis.) Moreover, by employing these measures, one also achieves a situation whereby the axial chromatic errors of degree 2—which in the case of a conventional corrector would be strongly increased by this corrector—are reduced once again in the present corrector as a result of the above-mentioned measures.

In a further embodiment of the particle-optical appliance according to the invention, a further quadrupole lens from the first group of optical elements and a further quadrupole lens from the second group of optical elements are each embodied as a combination of a magnetostatic and an electrostatic quadrupole. The technical effect of these measures is that it is possible to make further chromatic aberrations exactly equal to zero, namely either the chromatic magnification error ($C_{cm}$) or the axial chromatic error of degree two ($C_{cc}$). Although it is possible in this manner and with these measures to make, according to choice, one of both errors exactly equal to zero and to reduce the other, it is hereby generally not possible to simultaneously make both exactly equal to zero.

In yet a further embodiment of the particle-optical appliance according to the invention, a transfer lens system is placed between the corrector and the objective to be corrected, which system causes the particle rays to pass through a point of intersection in the optical axis, at the location of which point of intersection a seventh quadrupole is placed. It should be pointed out that a transfer lens system should also be interpreted as referring to a single lens. The technical effect of said measures is that, once again, it is hereby possible to make further chromatic aberrations exactly equal to zero, namely either the chromatic magnification error ($C_{cm}$) or the axial chromatic error of degree two ($C_{cc}$). In this case also, it is generally not possible, using these measures, to simultaneously make both these errors exactly equal to zero.

In yet a further embodiment of the particle-optical appliance according to the invention, the three quadrupole lenses from the first group of optical elements and the three quadrupole lenses from the second group of optical elements are all embodied as a combination of magnetostatic and electrostatic quadrupoles, and the first, the second, the fifth and the sixth quadrupole are also embodied to be achromatic. Using these measures, three types of lens errors can be corrected, namely:

(1) The axial chromatic lens error of the first order and the second degree, which is indicated by $C_{cc}$;
(2) The geometric-chromatic mixed axial lens errors of the third order and the first degree. These mixed lens errors consist of three components, namely
   a component that is circularly symmetric about the optical axis, indicated by $C_{3c}$;
   a component that demonstrates two-fold symmetry about the optical axis, indicated by $S_{3c}$; and
   a component that demonstrates four-fold symmetry about the optical axis, indicated by $A_{3c}$; and
(3) The non-axial chromatic lens error of the first order and the first degree, indicated by $C_{cm}$.

It should be pointed out that, using the above-mentioned measures, of said three types of lens error, two can generally be simultaneously made equal to zero, whereby the third—although made much smaller—does not become exactly equal to zero.

In yet another embodiment of the invention, at least three further octupoles are added, which are placed at the locations of the first, the second and the third octupole, respectively, which first, second and third octupoles are even octupoles and which first, second and third further octupoles are uneven octupoles, each of which uneven octupoles, as a result of a cross-section perpendicular to the optical axis, consists of a first and a second portion, in which the ratio of the excitations of the first and the second portion of each uneven octupole is such that the contribution of the uneven octupoles to the third-order axial aberrations is equal to zero, and in which the total excitation of all uneven octupoles is such that the anisotropic coma of the combination of the aberration-correcting means and the objective lens to be corrected is equal to zero. Because the three further octupoles can be of relatively small optical power, it is easily possible in this manner to achieve a correction of the anisotropic coma.

The invention will be further elucidated on the basis of the figures, whereby identical reference numerals indicate corresponding elements. To this end:

Figure 5A:
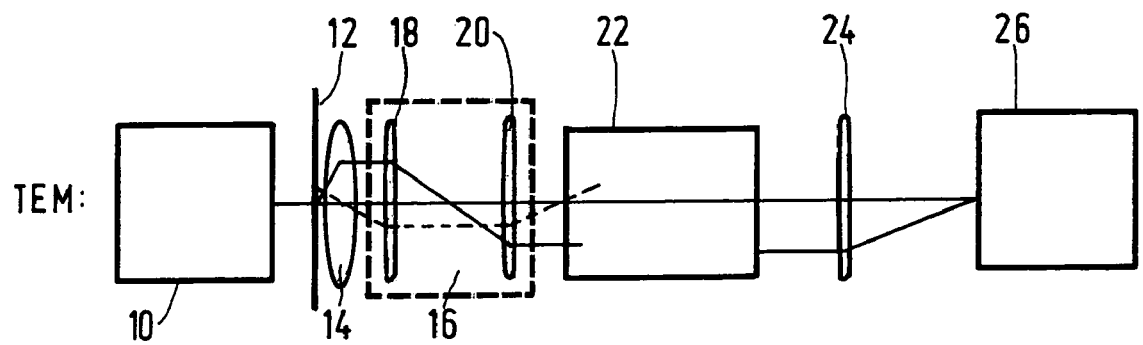
Figure 5B:
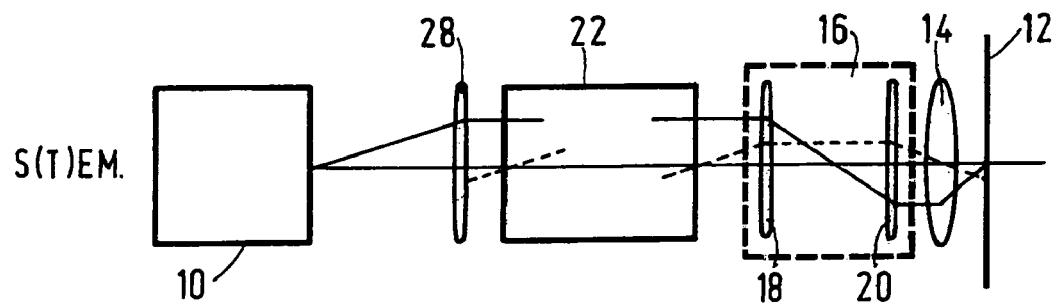

FIG. 5a renders a schematic depiction of the positioning of the corrector according to the invention in a TEM;

FIG. 5b renders a schematic depiction of the positioning of the corrector according to the invention in a SEM or a STEM.

THE PARAXIAL DESIGN

In this paragraph, an embodiment will first be given pertaining to the making of a paraxial design of a corrector according to the invention. So as to avoid rendering the calculations pertaining to the making of a corrector design with six quadrupoles and three octupoles extremely complicated and/or confused, one can adopt a number of simplifying initial conditions. Such initial conditions can, in principle, be freely chosen, whereby the number of such initial conditions must naturally lie within the degrees of freedom offered by the design of corrector. A first approximation of the final design makes use of (and is thus valid for) the paraxial propagation of rays in the corrector.

Such initial conditions may, for example, be:
(1) One chooses a corrector that is telescopic, i.e. a ray incident upon the corrector parallel to the optical axis will also emerge from the corrector parallel to the optical axis;
(2) The six quadrupoles and two of the three octupoles are positioned w.r.t. one another on the optical axis in such a manner that a plane of mirror symmetry is present (perpendicular to the optical axis), which, in this case, means that, when mirrored w.r.t. that symmetry plane, the locations of three of the six quadrupoles yield the locations of the remaining three quadrupoles, and that, when mirrored, the location of one of the two octupoles yields the location of the other of the two octupoles;
(3) The excitations of the six quadrupoles are anti-symmetric w.r.t. the symmetry plane, which is to say that, in the case of an electrostatic embodiment of the quadrupoles, a positive (negative) pole on one side of the symmetry plane corresponds to a negative (positive) pole on the other side of the symmetry plane, and that, in the case of a magnetostatic embodiment of the quadrupoles, a north pole (south pole) on one side of the symmetry plane corresponds to a south pole (north pole) on the other side of the symmetry plane.

Moreover, one would naturally also like the conditions according to the current invention to be satisfied, i.e. (1) that in a first axial plane, further referred to as the x-z plane, the first and the second octupole are not imaged onto one another, but the second and the third octupole are, and (2) that in a second axial plane perpendicular to the first axial plane, further referred to as the y-z plane, the first and second octupole are not imaged onto one another, but the first and the third octupole are, and (3) that an axial ray in the x-z plane passes through the axial point of the first octupole and in the y-z plane passes through the axial point of the second octupole. The above-mentioned initial conditions and requirements result in five equations, as will be demonstrated hereunder.

The ray propagation in an optical system with quadrupoles is determined by means of two independent rays in the x-z plane and two independent rays in the y-z plane. As usual, the independent rays are chosen to be the co-called axial ray and the field ray. In this context, an axial ray is understood to be a ray that, as regards a sample to be investigated in the particle-optical appliance, intersects that sample in the axial point of the sample, and a field ray is understood to be a ray that intersects the sample outside the axial point of the sample.

The positive direction of the optical axis is indicated by z; the course of an axial ray in dependence upon z in the x-z plane is indicated by $x_a(z)$, that of a field ray in the x-z plane by $x_f(z)$, that of an axial ray in the y-z plane by $y_a(z)$, and that of a field ray in the y-z plane by $y_f(z)$.

As is generally known to persons skilled in the relevant art, the octupoles in quadrupole-octupole correctors have no effect on the paraxial ray propagation in the corrector. It is therefore only the quadrupoles that determine the paraxial ray propagation in the corrector. By assuming the above-mentioned mirror symmetry, it holds that two independent paraxial rays in front of the mirror plane in the x-z plane (y-z plane) demonstrate the same course as those two rays behind the mirror plane in the y-z plane (x-z plane). In the form of a formula, this can be expressed as follows: $y_a(z)=x_a(-z)$, $y'_a(z)=-x'_a(-z)$, $y_f(z)=-x_f(-z)$ and $y'_f(z)=x'_f(-z)$. In these expressions, $x'_a(z)$, $y'_a(z)$, $x'_f(z)$ and $y'_f(z)$ are the derivatives with respect to z of the respective rays, as a function of z. From these expressions, the following four relations are obtained at the location of the symmetry plane with position z=0: $x_a(0)=y_a(0)$, $x'_a(0)=-y'_a(0)$, $x'_f(0)=y'_f(0)$ and $x_f(0)=-y_f(0)$. In these last four relations, $x'_a(0)$, $x'_f(0)$, $y'_a(0)$ and $y'_f(0)$ are the respective slopes of the rays $x_a(z)$, $x_f(z)$, $y_a(z)$ and $y_f(z)$ at the location of the symmetry plane. One must realize in this instance that, of these four relations, only three are independent, because one must also satisfy the condition that the determinant of the transfer matrix be equal to 1. As a result of this dependence, one of the four relations set forth above can be omitted, e.g. $x_f(0)=-y_f(0)$, so that only three mutually independent relations remain. Consequently, so as to arrive at the five equations previously referred to, two further equations are required.

To this end, one must first satisfy the stipulations according to the present invention that 1) an axial ray in the first axial plane (i.e. the x-z plane) passes through the axial point of the first octupole, and that 2) an axial ray in the second axial plane (i.e. the y-z plane) passes through the axial point of the second octupole. Satisfying one of these stipulations gives rise to an equation; for example, satisfying stipulation 1) gives rise to the equation $x_a(0)=x'_a(0)d$. This latter equation is obtained based upon the insight that satisfying these requirements is equivalent to the situation whereby the field rays are refracted in such a manner by the first three quadrupoles that, as a result, a line focus is formed (perpendicular to the direction of the line focus in the x-z plane) in the middle of the same octupole; as a result, the relation $x_a(0)=x'_a(0)d$ applies. As a result of the assumed symmetry (see the above-mentioned starting conditions (2) and (3)), satisfying one of the stipulations (in this case, therefore, the above-mentioned condition 1)) results in the other stipulation being satisfied (above-mentioned condition 2)). In this manner, satisfying stipulations 1) and 2) leads to just one equation, namely the above-mentioned equation $x_a(0)=x'_a(0)d$, which forms the fourth equation.

Secondly, one must also satisfy the stipulations according to the invention that 3) in a first axial plane (i.e. the x-z plane) the first and the second octupole are not imaged upon one another, and the second and the third octupole are imaged upon one another, whereby the relevant ray is the field ray in the x-z plane $x_f(z)$, and that 4) in a second axial plane (i.e. the y-z plane) perpendicular to the first axial plane, the first and the second octupole are not imaged upon one another, and the first and the third octupole are imaged onto one another, whereby the relevant ray is the field ray in the y-z plane $y_f(z)$. Satisfying one of these stipulations gives rise to an equation; for example, satisfying stipulation 4) leads to the equation $y_f(0)=y'_f(0)d$. As a result of the symmetry already referred to above, satisfying stipulations 3) and 4) leads to the one equation referred to above, viz. $y_f(0)=y'_f(0)d$, which forms the fifth equation.

In summary, the five equations that apply at the location of the symmetry plane can be expressed as follows:

$$x_a(0)=y_a(0) \quad (1)$$

$$x'_a(0)=-y'_a(0) \quad (2)$$

$$x'_f(0)=y'_f(0) \quad (3)$$

$$x_a(0)=x'_a(0)d \quad (4)$$

$$y_f(0)=y'_f(0)d \quad (5)$$

So as to arrive at a design for an aberration corrector according to the invention based on these five equations, the following quantities must be determined:
- the z-position of each of the four quadrupoles (3 parameters), and
- the thickness in the z-direction of each of the three quadrupoles (3 parameters), and
- the excitation of each of the three quadrupoles (3 parameters), and
- the z-position of the octupole that is placed at a distance d from the symmetry plane, i.e. the value of d (1 parameter), and
- the desired z-position of the third octupole (1 parameter).

So as to arrive at a design, a total of 3+3+3+1+1=11 parameters must therefore be determined; the equations (1) to (5) set forth above must thereby be satisfied, which means that, in designing a corrector, 11−5=6 degrees of freedom are still available. Very many paraxial designs are therefore possible and, so as to maintain a good overview of the design process, one can initially adopt a simplified starting scenario and can use the design resulting therefrom as a starting scenario for the complete, non-simplified design process.

Figure 1A:
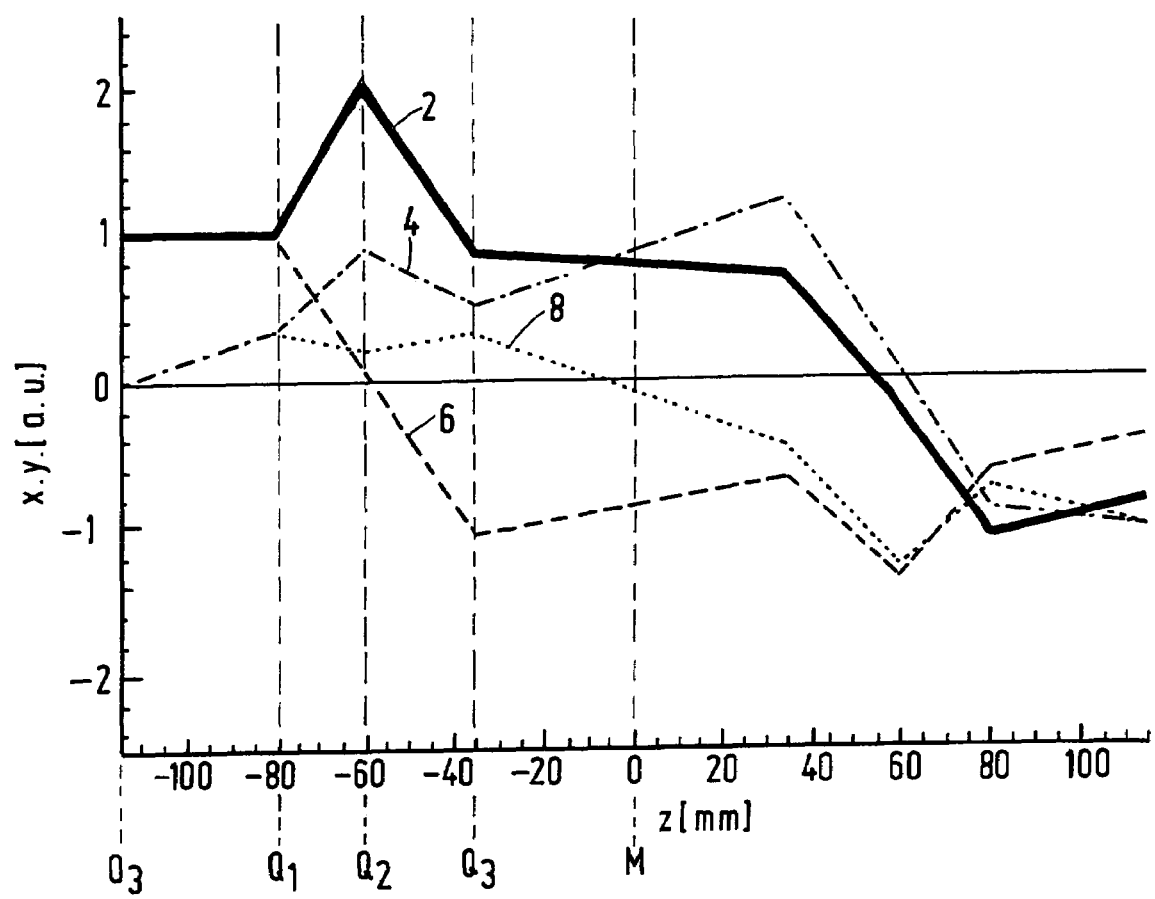
FIG. 1a illustrates the course of paraxial field rays $x_f(z)$ and $y_f(z)$ and axial rays $x_a(z)$ and $y_a(z)$ in the x-z plane and the y-z plane in the case of a corrector according to the invention, with assumed initial values of the locations and excitations of the quadrupoles in the thin-lens approximation.

As the simplified starting scenario, one may, for example, choose a thin lens approximation for the quadrupoles, i.e. one initially chooses a thickness of zero. As a result, these three parameters do not have to be determined, so that the number of degrees of freedom is reduced from six to three. This means that, if a proper choice of the value of these last three parameters is made in advance, a set of five (non-linear) equations in five variables has to be solved. The value of these three parameters to be chosen in advance may be: the distance $z_{Q1}$ of the first quadrupole to the symmetry plane M is 80 mm, the distance $z_{Q2}$ of the second quadrupole to the symmetry plane M is 60 mm, and the distance $z_{O1}$ of the first octupole to the symmetry plane M is 60 mm. The above-mentioned set of five equations can now be solved in a manner known per se, e.g. with the aid of the so-called multi-dimensional Newton-Raphson method. In order to apply this method, a properly chosen set of initial values is required, e.g. the distance $z_{O3}$ of the third octupole to the symmetry plane=115 mm, the distance $z_{Q3}$ of the third quadrupole to the symmetry plane=35 mm and, further, three excitations for the quadrupoles, all of which are equal and have alternating sign. With these starting assumptions, and without solving the above-mentioned five equations, a course of paraxial paths as depicted in FIG. 1a would be obtained. In that figure (and in FIGS. 1b and 1c), the axial ray in the x-z plane $x_a$ is depicted by the solid bold line 2, the field ray in the x-z plane $x_f$ is depicted by the dot-dashed line 4, the axial ray in the y-z plane $y_a$ is depicted by the thin dashed line 6, and the field ray in the y-z plane $y_f$ is depicted by the interrupted dashed line 8. Also depicted in these figures are the positions of the first quadrupole $Q_1$, the second quadrupole $Q_2$ and the third quadrupole $Q_3$, and the position of the first octupole $O_1$, the second octupole $O_2$, and the third octupole $O_3$ that is divided into two equal portions $O_{3a}$ and $O_{3b}$.

Figure 1B:
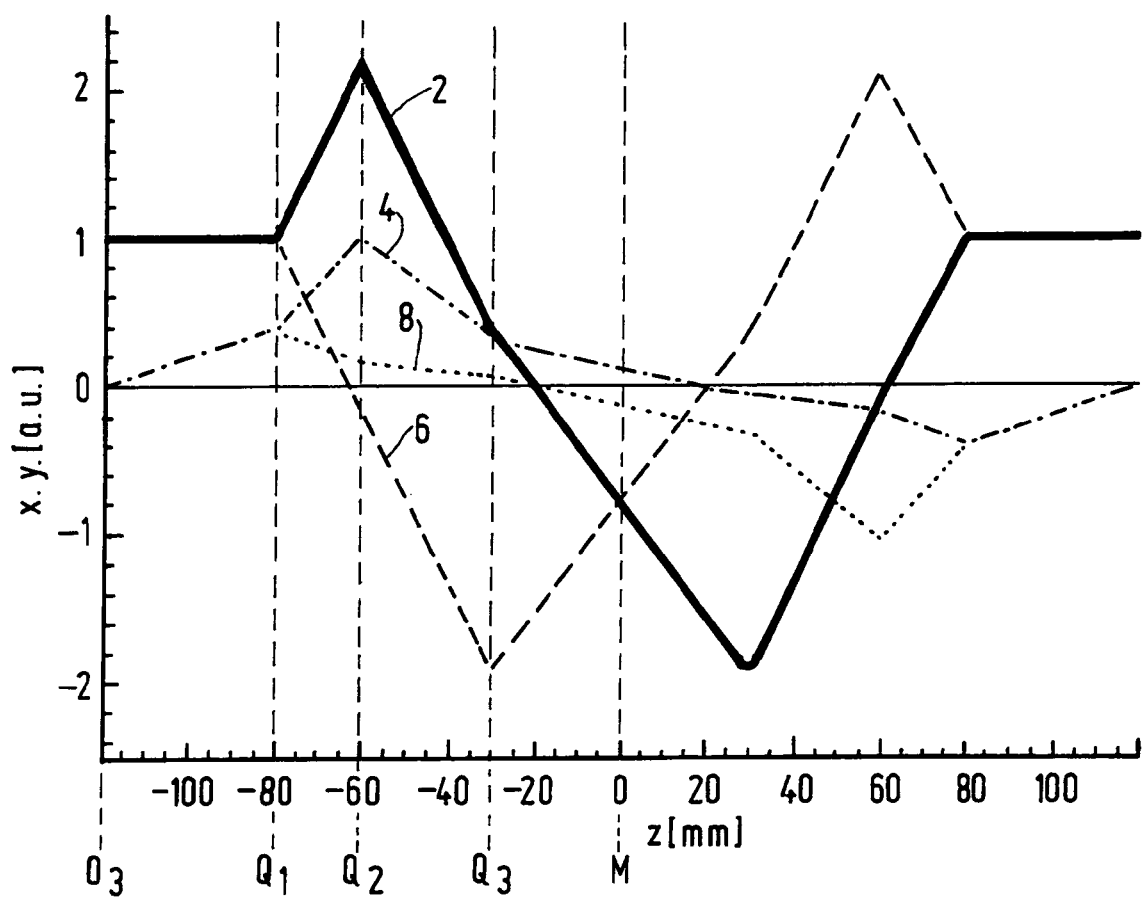
FIG. 1b illustrates the course of paraxial field rays $x_f(z)$ and $y_f(z)$ and axial rays $x_a(z)$ and $y_a(z)$ in the x-z plane and the y-z plane in the case of a corrector according to the invention, with the correct locations and excitations of the quadrupoles obtained by solving the equations applicable thereto in the thin-lens approximation.

By applying the iterating Newton-Raphson method, the following solutions are found: the distance $z_{O3a}$ of the portion $O_{3a}$ of the third octupole to the symmetry plane=120 mm, the distance $z_{Q3}$ of the third quadrupole to the symmetry plane=30 mm and, further, three excitations for the quadrupoles such that the course of paraxial paths obtained as a result thereof is as depicted in FIG. 1b.

Figure 1C:
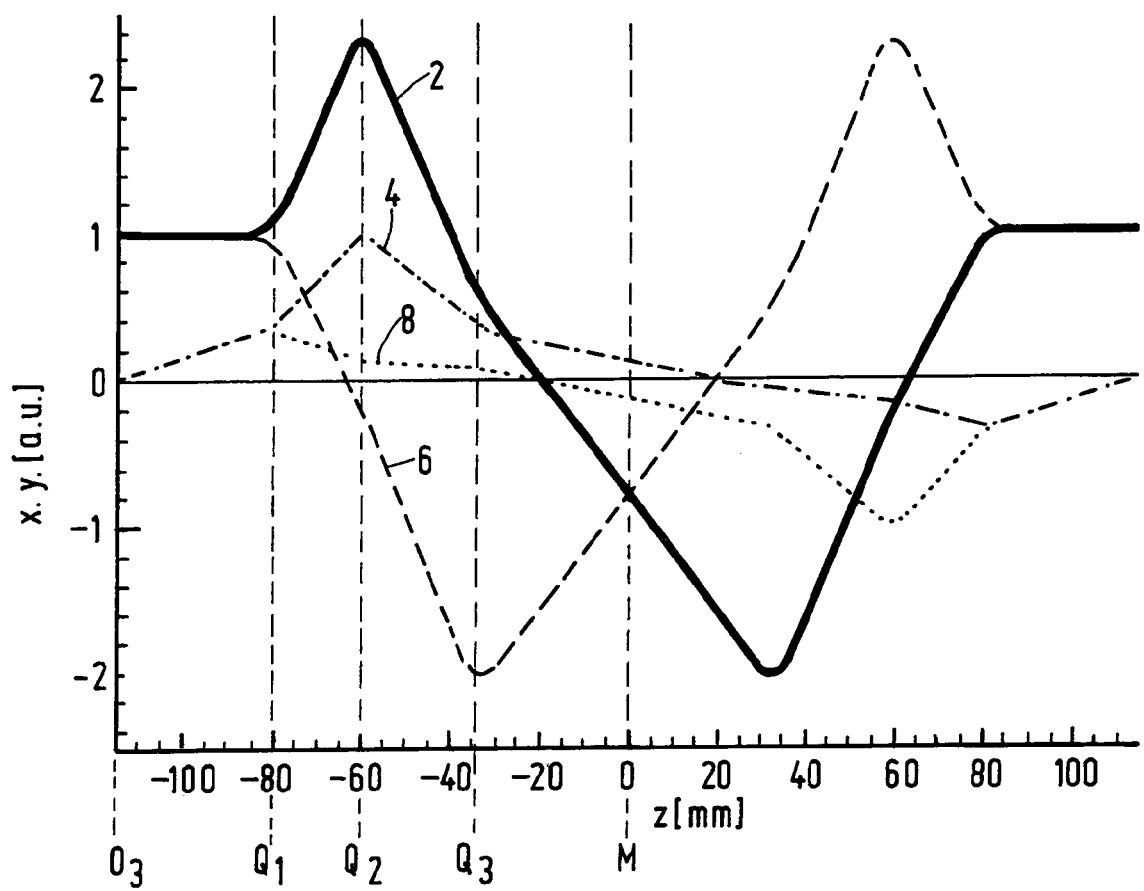
FIG. 1c illustrates the course of paraxial field rays $x_f(z)$ and $y_f(z)$ and axial rays $x_a(z)$ and $y_a(z)$ in the x-z plane and the y-z plane in the case of a corrector according to the invention, with the correct locations and excitations of the quadrupoles obtained by solving the equations applicable thereto in the case of a thickness not equal to zero.

One can choose a similar approach in the case of an assumption that the lens thickness is not equal to zero. As an initial condition, a thickness of 10 mm is now assumed for all quadrupoles. The iterative Newton-Raphson method is now applied again to this configuration, which finally leads to a course of paraxial paths as depicted in FIG. 1c. In this figure, the middle of the quadrupoles is depicted. It is hereby found that the distance $z_{O3}$ of the third octupole to the symmetry plane is 115 mm and that the distance $Z_{Q3}$ from the middle of the third quadrupole to the symmetry plane is 34 mm. The paraxial design of the corrector is thus completed.

The Definitive Design (a) For TEM, STEM and SEM in General

In order to arrive at a practical design of corrector starting out from the paraxial design, a number of further requirements have to be met. These requirements lead, on the one hand, to conditions regarding the error-correcting power and, on the other hand, to practical conditions regarding the application of the corrector, particularly in a specific particle-optical appliance, such as a Transmission Electron Microscope (TEM), a Scanning Electron Microscope (SEM), or a Scanning Transmission Electron Microscope (STEM). In order to satisfy said requirements/conditions, it is sometimes desirable to assign to the six freely chosen parameters (the six degrees of freedom) in the description of the paraxial design set forth above an initial value that is different from the values that are mentioned in the paraxial design above. In this manner, one can satisfy all sorts of requirements as set forth above, e.g. (1) keeping to a low value the signal-to-noise ratio in the excitation current and/or excitation voltage of the optical elements, (2) for a given bore value, preventing magnetic saturation of the iron circuits of the optical elements, or keeping electrostatic elements below the electrical breakdown voltage, (3) assigning values to the geometric aberration coefficients $C_3$ (=the generally known 3rd-order spherical aberration) and $C_5$ (=the fifth-order spherical aberration) in such a manner that these lens errors compensate one another, and (4) reducing the seventh-order axial aberrations to a sufficient extent.

It should be pointed out that the consideration as to whether or not to electromagnetically excite the quadrupoles in the corrector so as to correct chromatic aberration, and whether or not to adjust these quadrupoles so as to be exactly achromatic, is dependent upon the area of application of the corrector. One can distinguish two principal areas of application where this is concerned, namely a first area of application involving high-voltage TEM (HV TEM) and (high-voltage) STEM (HV STEM), and a second area of application involving SEM and low-voltage TEM (LV TEM).

In the first area of application (HV TEM and HV STEM), the quadrupoles $Q_1$, $Q_2$, $Q_5$ and $Q_6$ are all embodied to be exclusively magnetic or exclusively electric; of themselves, they are therefore not achromatically embodied. Quadrupoles $Q_3$ and $Q_4$ are both electromagnetically embodied, and their chromatic state is such that they demonstrate a chromatic deviation that is opposite to that of the objective lens to be corrected, as a result of which the axial chromatic aberration thereof is corrected.

In the second area of application (SEM and LV TEM), all quadrupoles are electromagnetically embodied. The quadrupoles $Q_{1\ and\ Q6}$ are thereby of themselves exactly achromatic. The chromatic state of the quadrupoles $Q_2$ and $Q_5$ is such that they deviate to a very small extent from an achromatic state, so that the condition $C_{cmx}=C_{cmy}=0$ is satisfied. The chromatic state of the quadrupoles $Q_3$ and $Q_4$ is such that they demonstrate a chromatic deviation that is opposite to that of the objective lens to be corrected, as a result of which the axial chromatic aberration thereof is corrected (b1) The Definitive Design for High-Voltage TEM and STEM Specifically In the case of the definitive design specifically for a TEM, some additional requirements can be formulated, viz. (5) reducing the fifth-order coma to a sufficient extent, and (6) reducing the chromatic magnification error $C_{cm}$ to a sufficient extent. The importance of satisfying requirement (3) lies in the fact that, in this manner, thin samples that can be regarded as phase objects still maintain a sufficient Contrast Transfer Function in images with extremely high resolution. In the case of the definitive design specific to a SEM or a STEM, it is true to say that satisfying requirements (5) and (6) is not of primary importance, but a TEM design in which those requirements are satisfied can be used without drawbacks in the case of a STEM. It is therefore easy to use this design both in the case of a TEM and a STEM.

Satisfying requirement (6) is of particular importance in the case of a TEM, in which acceleration voltages of the order of magnitude of 300 kV are commonplace. In that case, for the purpose of correcting chromatic aberration, at any rate the third and the fourth quadrupole are embodied as electromagnetic elements, but, because of the high acceleration voltage, the first, second, fifth and sixth quadrupole are preferably embodied to be purely magnetic. However, this can have consequences as regards the chromatic magnification error, which can be explained as follows. Between the corrector and the objective to be corrected, a transfer lens system is placed, which system can be embodied to have a quadrupole lens. If no quadrupole lens is present therein, the chromatic magnification error cannot be made exactly equal to zero. If a quadrupole lens is present therein, one can choose between two situations: one can make the chromatic magnification error exactly equal to zero but, in that case, the third-order isotropic coma will not be equal to zero, or one can make the third-order isotropic coma exactly equal to zero but, in that case, the chromatic magnification error will not be equal to zero. (The lens errors that do not remain exactly equal to zero maintain a small residual value in this case). One therefore has a choice between a full correction of the chromatic magnification error and a full correction of said third-order isotropic coma, depending on the area of application of the corrector.

In performing the actual design process, use is also made of the insight that still further improvements in the optical properties of the design can be achieved by additionally applying octupoles of relatively low optical power (or rather: of relatively little influence on the electrons) at the location of the first, the second, the fifth and the sixth quadrupole; these four extra octupoles must also satisfy the symmetry requirements w.r.t. the plane of mirror symmetry. They are applied inter alia to correct the intrinsic third-order aberrations of the associated quadrupoles.

If the transfer lens system referred to earlier is present, a further degree of freedom is obtained in the design, viz. the intrinsic magnification of this transfer lens system.

During the design process, for the purpose of calculating the excitations of all octupoles, one maintains the requirement that the third-order axial aberrations and the third-order isotropic coma (in the event that the quadrupole lens in the transfer lens system is not active) be reduced to zero. The aberration coefficients concerned (eight in principle, but, as a result of the mirror symmetry, only four are independent) are linearly dependent upon the octupole excitations, and are therefore described using four linear equations. The total number of octupoles is formed in this instance by the four relatively strongly excited octupoles and the four octupoles of relatively little influence. As a result of the mirror symmetry, these eight octupoles thus also have four degrees of freedom. The octupole excitations to be determined for the total of eight octupoles can therefore be found from four linear equations with four unknowns. In addition, one has the possibility during the design process, at locations where the zero crossings of the rays in the corrector should lie in the relatively strongly excited octupoles, not to situate these zero crossings exactly in the middle of those octupoles, but rather at a somewhat deviated position, though still within the z-position of the iron circuit or of the electrodes of the octupoles, and thus within the effective region of the octupole fields. This possibility yields a further three degrees of freedom.

Execution of this design process occurs with the aid of a simulation program in which all sorts of parameters can be set according to desire. Such a simulation program must satisfy a number of requirements, the most important of which are:

the simulation program must be able to simulate the behavior of quadrupoles with a finite thickness, and the attendant fringing fields, and the simulation program must be able to simulate all aberrations of the quadrupoles and of the octupoles with a finite thickness, and the attendant fringing fields, and the simulation program should preferably contain a routine for solving n equations with n unknowns (e.g. according to the Newton-Raphson method), in which n is at least equal to five, so as to be able to tackle the five equations (1) to (5) that apply at the position of the symmetry plane in the paraxial design, and the simulation program should preferably be able to calculate the above-mentioned octupole excitations, which requires a routine for solving four equations in four unknowns.

Such a simulation program can, for example, be obtained by modifying an existing, commercially available program so as to satisfy the above-mentioned requirements.

(b2) The Definitive Design for SEM or Low-Voltage TEM Specifically

The definitive design specifically for a SEM or a low-voltage TEM is basically the same as that for high-voltage TEM, whereby an extra requirement must be formulated as regards two quadrupoles, namely $Q_1$ and $Q_6$ or $Q_2$ and $Q_5$. This is because, when the quadrupoles $Q_1$, $Q_2$, $Q_5$ and $Q_6$ are all made exactly achromatic, a (small) chromatic magnification error will usually arise, indicated by $C_{cmx}$ and $C_{cmy}$ (for the x-z plane and the y-z plane, respectively). So as to make this chromatic magnification error exactly equal to zero, the quadrupoles $Q_2$ and $Q_5$ or $Q_1$ $_{and\ Q6}$ must be made somewhat achromatic in equal measure, with a deviation from the magnetic excitation that is of the order of magnitude of 1% of the total magnetic excitation.

(c1) The Course of the Design Process in the Case of STEM or High-Voltage TEM

The design process now proceeds along the following lines:

If one considers as given quantities the acceleration voltage of the electrons and the optical properties of the objective lens to be corrected, then a relatively large number of degrees of freedom remains for use in the actual design process. A distinction can be made between two groups of degrees of freedom, viz. those degrees of freedom for which values must be chosen at the start of the design process, and those degrees of freedom whose values must be determined during the design process. The first group of degrees of freedom is formed by:

The six degrees of freedom described in the paragraph "The paraxial design", which are left over from the original eleven degrees of freedom after satisfying the five equations that apply at the location of the symmetry plane; and The optical power of the third and fourth quadrupoles, which, for the purpose of correcting the chromatic aberration, are embodied as electromagnetic quadrupoles. The electric field strength is thereby determined as follows: starting with the paraxial design with only magnetic excitation, the paraxial excitation is augmented by an extra magnetic excitation M' and an electrostatic field strength E whose total value is such that the contribution of M'+E to the quadrupole optical power is zero for a nominal energy $U_o$ and that $C_c$-correction is obtained for the objective. One of the quadrupoles works thereby for the x-z plane and the other quadrupole for the y-z plane. This addition of electric quadrupole field strength yields, in principle, 1 degree of freedom (because of the mirror symmetry). The intrinsic magnification of the transfer lens system similarly yields, in principle, 1 degree of freedom. If, however, for one of these two parameters (electric quadrupole field strength and intrinsic magnification) a value is chosen, then the other parameter can be calculated via the requirement that the total chromatic aberration be zero. This therefore yields a balance of 1 degree of freedom; and The possibility, referred to above in the paragraph (b1) "The definitive design for high-voltage TEM and STEM specifically", at those locations where the zero crossings of the rays within the corrector must lie within the octupoles, not to situate these zero crossings exactly in the middle of the octupoles but, rather, somewhat deviated therefrom (in general, 4 degrees of freedom, but, as a result of said mirror symmetry, 2 degrees of freedom).

In total, this first group therefore yields 6+1+2=9 degrees of freedom.

The second group of degrees of freedom is made up of those degrees of freedom whose values have to be determined during the design process. The second group of degrees of freedom is formed by:

Those octupole excitations, referred to above in the paragraph "The definitive design for TEM and STEM specifically", for which the third-order axial aberrations and the isotropic coma become zero. As set forth there, 4 degrees of freedom follow herefrom; and The positions of the first portion and the second portion of the third octupole, which positions should be chosen in such a manner that the lens error indicated by $D_5$ (the axial fifth-order aberration with four-fold symmetry) becomes zero. As a result of the mirror symmetry, this yields 1 degree of freedom; and Optionally: as referred to in the paragraph (b1) "The definitive design for high-voltage TEM and STEM specifically", the excitation of the quadrupole lens in the transfer lens system so as make the chromatic magnification error $C_{cmx}$, $C_{cmy}$ equal to zero. This optionally yields 1 degree of freedom.

In total, this second group therefore yields 4+1=5 (optionally 6) degrees of freedom, so that the design process for TEM and STEM has a total of 9+5=14 (optionally 9+6=15) degrees of freedom.

(c2) The Course of the Design Process in the Case of SEM or Low-Voltage TEM

The course of the design process in the case of a SEM or a low-voltage TEM is basically the same as that for a TEM, whereby it should be understood that the extra requirements for the quadrupoles $Q_2$ and $Q_5$ or $Q_1$ and $Q_6$ set forth above in the paragraph (b2) "The definitive design for SEM or low-voltage TEM specifically" must be satisfied. In the situation whereby the quadrupoles $Q_1$, $Q_2$, $Q_5$ and $Q_6$ are all initially made exactly achromatic, this therefore means that, in one of said two pairs of quadrupoles $Q_2$ and $Q_5$ or $Q_1$ and $Q_6$, the exactly adjusted achromatic state will be made somewhat chromatic, so as to satisfy $C_{cmx}=C_{cmy}=0$.

(d) The Steps in the Design Process for TEM, STEM and SEM (1) A starting value is chosen for the nine parameters of the first group (see the paragraph "The course of the design process in the case of STEM or high-voltage TEM" above). Specifically for SEM or low-voltage TEM, the quadrupoles $Q_1$, $Q_2$, $Q_5$ and $Q_6$ are all initially made exactly achromatic, after which quadrupoles $Q_2$ and $Q_5$ or $Q_1$ and $Q_6$ are made somewhat chromatic, so as to satisfy $C_{cmx}=C_{cmy}=0$;

(2) A starting value is chosen for the positions of the first portion ($O_{3a}$) and the second portion ($O_{3b}$) of the third octupole (see the paragraph (c1) "The course of the design process in the case of high-voltage TEM and STEM" above);

(3) The five equations that apply at the location of the symmetry plane, as referred to in the paragraph "The paraxial design", are solved;

(4) The excitation of all octupoles is determined in such a manner that the third-order axial aberrations and the isotropic coma become zero. As set forth above in the paragraph (b1) "The definitive design for high-voltage TEM and STEM specifically", these excitations are calculated by solving four linear equations with four unknowns;

(5) One now checks if the axial fifth-order aberration with four-fold symmetry (coefficient $D_5$) is equal to zero. If that is not the case, then the starting values referred to in step (2) above are modified, and steps (2) to (5) are repeated as often as necessary to ensure that $D_5$ is zero;

(6) All relevant aberrations are determined, and one also checks if the requirements with regard to the electrical power supplies are satisfied. Said relevant aberrations are: the fifth-order spherical aberration (coefficient $C_5$), the fifth-order isotropic coma, the seventh-order aberrations, and the isotropic chromatic magnification errors (coefficients $C_{cmx}$ and $C_{cmy}$). In the case of these aberrations, it is checked whether they have been made sufficiently small. The requirements w.r.t. the electrical power supplies concern the stability, i.e. whether variations in voltage and/or current as a function of time and the signal-to-noise ratio are sufficiently small. If these requirements are not satisfied, then steps (1) to (6) are repeated using modified starting values until the design of corrector satisfies the stipulated requirements. In the event of application in a SEM or a low-voltage TEM, one can also make the aberration coefficients $A_{3c}$ and $C_{3c}$ equal to zero in this manner. Moreover, as a result of the symmetry w.r.t. the mirroring middle plane M, it transpires that $S_{3c}=0$, so that all mixed (i.e. mixed geometric-chromatic) aberrations of the third order and the first degree are thus equal to zero. The aberration coefficients $A_{3c}$, $C_{3c}$ and $S_{3c}$ referred to here are defined in analogy to the definitions known from the aforementioned article by M. Haider. The following expression thereby applies:

$$-S_3 = Re\left(\frac{1}{4}\omega^2\varpi^2 C_3 + \omega^3\varpi S_3 + \frac{1}{4}\varpi^4 A_3\right)$$

in which the quantities in this expression correspond to the quantities employed in the relevant expression used by Haider. By incorporating a factor $\epsilon=\Delta U/U$ in this expression (U=the acceleration voltage), one obtains the expression for the coefficients of the mixed geometric-chromatic aberrations:

$$-S_{3c} = \epsilon Re\left(\frac{1}{4}\omega^2\varpi^2 C_{3c} + \omega^3\varpi S_{3c} + \frac{1}{4}\varpi^4 A_{3c}\right)$$

in which, by adding an index c to the aberration coefficients, one indicates that one is dealing here with the coefficients of the mixed geometric-chromatic aberrations.

Figure 2:
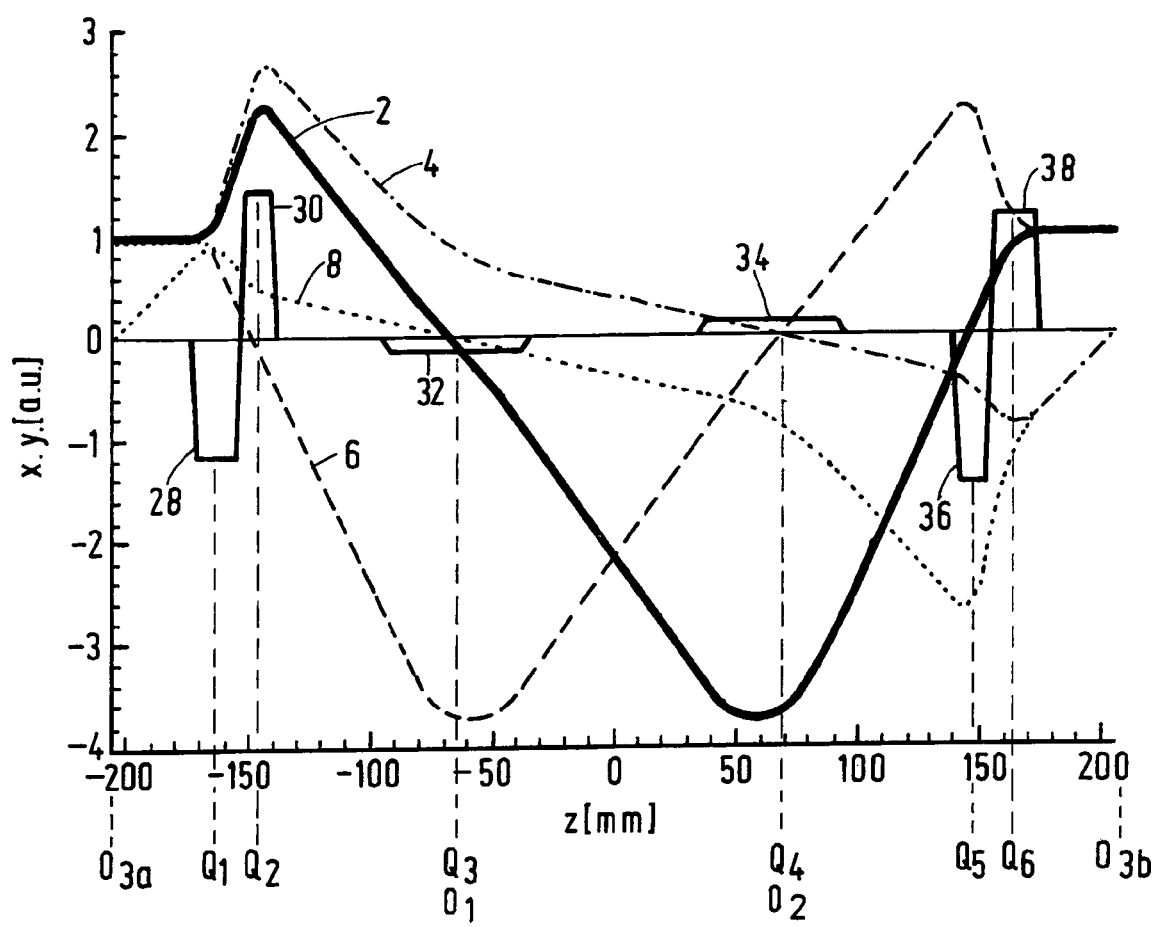
FIG. 2 illustrates the course of field rays $x_f(z)$ and $y_f(z)$ and axial rays $x_a(z)$ and $y_a(z)$ in the x-z plane and the y-z plane in the case of a corrector according to the invention, with the correct locations of the quadrupoles and octupoles with a thickness not equal to zero, specifically for application in a high-voltage TEM.

FIG. 2 relates to the course of rays in a corrector according to the invention for use in a STEM or a high-voltage TEM. In this figure, the course of axial rays 2 and 6 and of field rays 4 and 8 is depicted in the x-z plane and the y-z plane of the corrector. The axial ray in the x-z plane is thereby depicted by a solid bold line 2, the field ray in the x-z plane by a dot-dashed line 4, the axial ray in the y-z plane by a thin dashed line 6, and the field ray in the y-z plane by the interrupted dashed line 8.

The design of the corrector used hereby was obtained according to the above-mentioned paragraph "The steps in the design process for TEM, STEM and SEM". The locations on the optical axis (the z-axis) of the six quadrupoles $Q_1$ to $Q_6$ are herein depicted, as are the locations on the z-axis of both octupoles $O_1$ and $O_2$, and the locations of the portions $O_{3a}$ and $O_{3b}$ of the third octupole that has been divided into two equal portions. The plane of mirror symmetry is located at position z=0. Moreover, using the reference numerals 28, 30, 32, 34, 36 and 38, the excitations of the quadrupoles $Q_1$, $Q_2$, $Q_3$, $Q_4$, $Q_5$ and $Q_6$ are indicated in the form of the strength of the field on the optical axis.

The following values and data pertain to this design:
  The quadrupoles $Q_1$, $Q_2$, $Q_5$ and $Q_6$ are embodied to be solely magnetic.
  The quadrupoles $Q_3$ and $Q_4$ are embodied to be electromagnetic.
  At the locations of the quadrupoles $Q_1$, $Q_2$, $Q_5$ and $Q_6$, magnetic octupoles of relatively low optical power have been added.
  The portions $O_{3a}$ and $O_{3b}$ of the third octupole that has been divided into two equal portions are imaged onto the coma-free plane of the objective lens.
  Acceleration voltage: 300 kV.
  Focal length of the objective lens to be corrected: 2.3 mm.
  $C_c$ of the objective lens: 1.4 mm.
  $C_s$ of the objective lens: 1.2 mm.
  Internal radius of the multipoles: 2 mm.
  Length of the quadrupoles $Q_3$ and $Q_4$: 56 mm.
  Length of the octupole portions $O_{3a}$ and $O_{3b}$: 16 mm.
  Magnification of the transfer lens system: 1.2 (as a result of which the beam diameter at the entrance to the objective is 1.2 times as large as in the exit plane of the corrector).
  Octupole portions $O_{3a}$ and $O_{3b}$ are displaced by a distance of 2.92 mm w.r.t. their paraxial position (i.e. the position where the Gaussian rays cross the z-axis), away from the symmetry plane.
  The zero crossings of the rays $x_a$ and $y_f$ ($y_a$ and $x_f$) in quadrupole $Q_3$ ($Q_4$) are both displaced by a distance of 3.05 mm w.r.t. the middle of that quadrupole, away from the symmetry plane (i.e. they still coincide, but they no longer lie exactly in the middle of the quadrupole).

In Table 1 that follows, the aberrations of the combination of the corrector and the objective lens (specifically for a TEM) are depicted. In the table, the aberrations in rows 1 to 5 are indicated using the symbols according to the cited article by Haider et al. The third column relates to the situation whereby the quadrupole lens in the transfer lens system (Quadrupole Field Lens, QFL) is turned off; in the forth column, it is turned on.

| # | QFL | off | on |
|---|---|---|---|
| 1 | $C_3$, $S_3$, $A_3$ (mm) | 0 | 0 |
| 2 | $C_5$ (mm) | −0.31 | −0.31 |
| 3 | $S_5$ (mm) | 0 | −1.45 |
| 4 | $D_5$ (mm) | 0 | 0 |
| 5 | $A_5$ (mm) | 0 | 0 |
| 6 | $S_{80}$ (mm) | 5 | 7 |
| 7 | $S_{62}$ (mm) | −9 | −8 |
| 8 | $S_{44}$ (mm) | −31 | −30 |
| 9 | $S_{26}$ (mm) | 38 | 39 |
| 10 | $S_{08}$ (mm) | −5 | −2.5 |
| 11 | $S_{x30} = S_{x12}$ | 0 | −2.3 |
| 12 | $S_{y21} = S_{y03}$ | 0 | 2.3 |
| 13 | $i F_{an}$ | 0.7 i | 0.7 i |
| 14 | $S_{x50}$ | 8 | 4 |
| 15 | $S_{x32}$ | −42 | −46 |
| 16 | $S_{x14}$ | 3 | 4 |
| 17 | $S_{y41}$ | −8 | −4 |
| 18 | $S_{y23}$ | 43 | 47 |
| 19 | $S_{y05}$ | −3 | −3 |
| 20 | $C_{cx}$, $C_{cy}$ (mm) | 0 | 0 |
| 21 | $C_{ccx}$ (mm) | 7 | 12 |
| 22 | $C_{ccy}$ (mm) | 17 | 12 |
| 23 | $C_{cmx}$ | −3.0 | 0 |
| 24 | $C_{cmy}$ | 3.0 | 0 |

In rows 6 to 10 of Table 1, the seventh-order aberration coefficients are indicated; as is evident from the values concerned, these are of the order of magnitude of a few centimeters at most. Rows 11 and 12 indicate the coefficients of the isotropic coma. Row 13 relates to the anisotropic coma; the correction for this will be discussed in what follows. Rows 14 to 19 indicate the coefficients of the fifth-order coma; from the values concerned, it is evident that this group of lens errors is negligible. Row 20 indicates the coefficients of the chromatic aberration in both the x-z plane ($C_{cx}$) and the y-z plane ($C_{cy}$). Rows 21 and 22 indicate the coefficients of the axial chromatic error of degree two $C_{cc}$ in the x-z plane ($C_{ccx}$) and the y-z plane ($C_{ccy}$) respectively. Rows 23 and 24 indicate the coefficients of the chromatic magnification error ($C_{cm}$) in the x-z plane ($C_{cmx}$) and the y-z plane ($C_{cmy}$) respectively.

According to an aspect of the invention, it is possible to correct the anisotropic coma in the case of application in a TEM. This correction can be achieved by locating the various multipoles as in FIG. 2, in which a first octupole $O_1$, a second octupole $O_2$ and a third octupole $O_3$ are present (all magnetostatic), and in which the third octupole is divided into two equal portions $O_{3a}$ and $O_{3b}$. These four octupoles are of the even type, as will be explained further below.

To define an even or an uneven multipole (i.e. a multipole with even or uneven symmetry), the x and y coordinates are expressed in polar coordinates r and φ according to x=r cos φ and y=r sin φ. The azimuthal dependence of the scalar electrostatic potential is now proportional to cos (n φ) for even multipoles and proportional to sin (n φ) for uneven multipoles; for the scalar magnetostatic potential, it is so that the azimuthal dependence is proportional to sin (n φ) for even multipoles and proportional to cos (n φ) for uneven multipoles. Here, n is a whole number, e.g. n=2 for quadrupoles and n=4 for octupoles.

So as to achieve the correction of the anisotropic coma, said four even magnetostatic octupoles are modified, which modification can be thought of as occurring as follows:
1) A copy is made of each even octupole, which copies are located in such a manner that they have the same z position as the associated even octupoles, and each of which copies is rotated through 22.5° about the z-axis w.r.t. the original associated octupole; these rotated copies now form four uneven octupoles.
2) Next, one considers each of these four rotated copies as being divided into two equal portions by a cross-section perpendicular to the z-axis, namely a first portion and a second portion, after which
3) The excitations of the first and the second portion of the uneven octupole are chosen to have such a ratio that the contribution of the uneven octupoles to the third-order axial aberrations is equal to zero, and
4) The total excitation of all uneven octupoles is chosen in such a manner that the anisotropic coma of the combination of the corrector and the objective is equal to zero. In the case of this last point 4), it should be pointed out that, as a result of the symmetry w.r.t. the mirror plane z=0, the excitation of the uneven portions is anti-symmetric w.r.t. the symmetry plane.

Figure 3A:
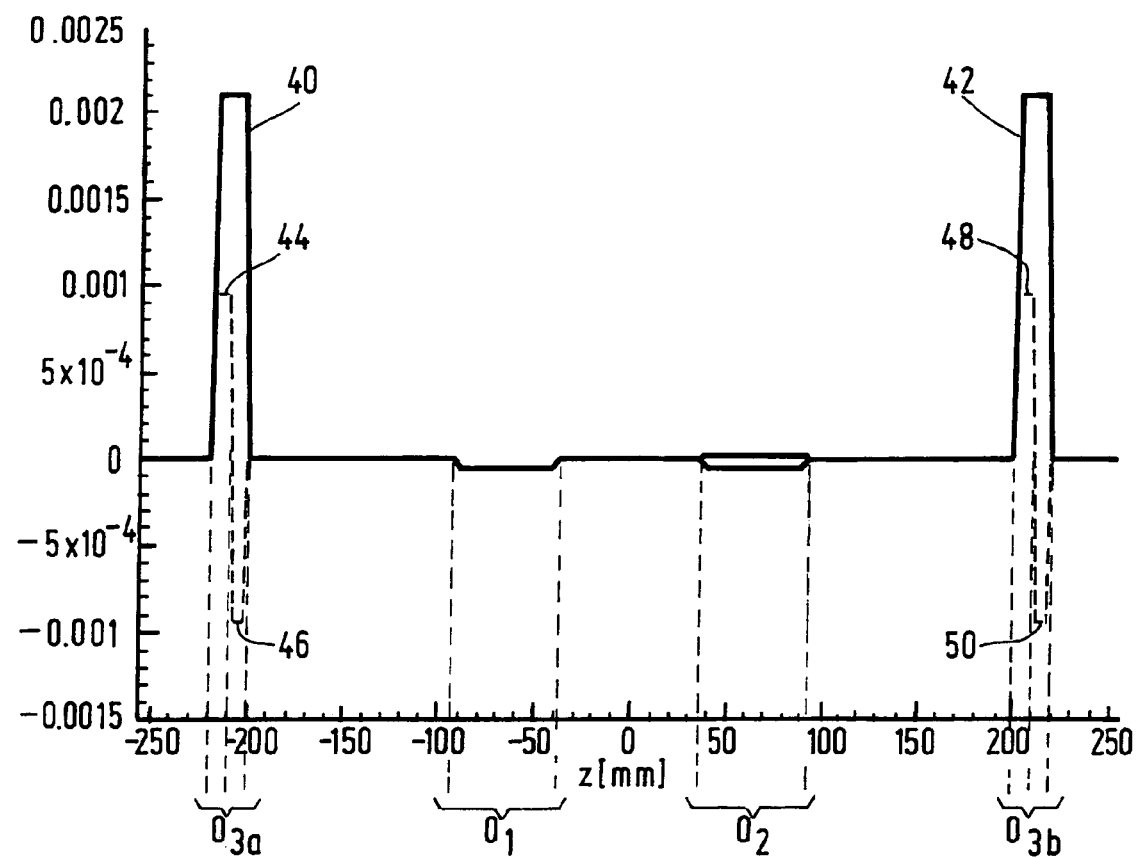
FIG. 3a illustrates the distribution on the z-axis of the magnetostatic field of some octupoles for the correction of the anisotropic coma in a TEM.
Figure 3B:
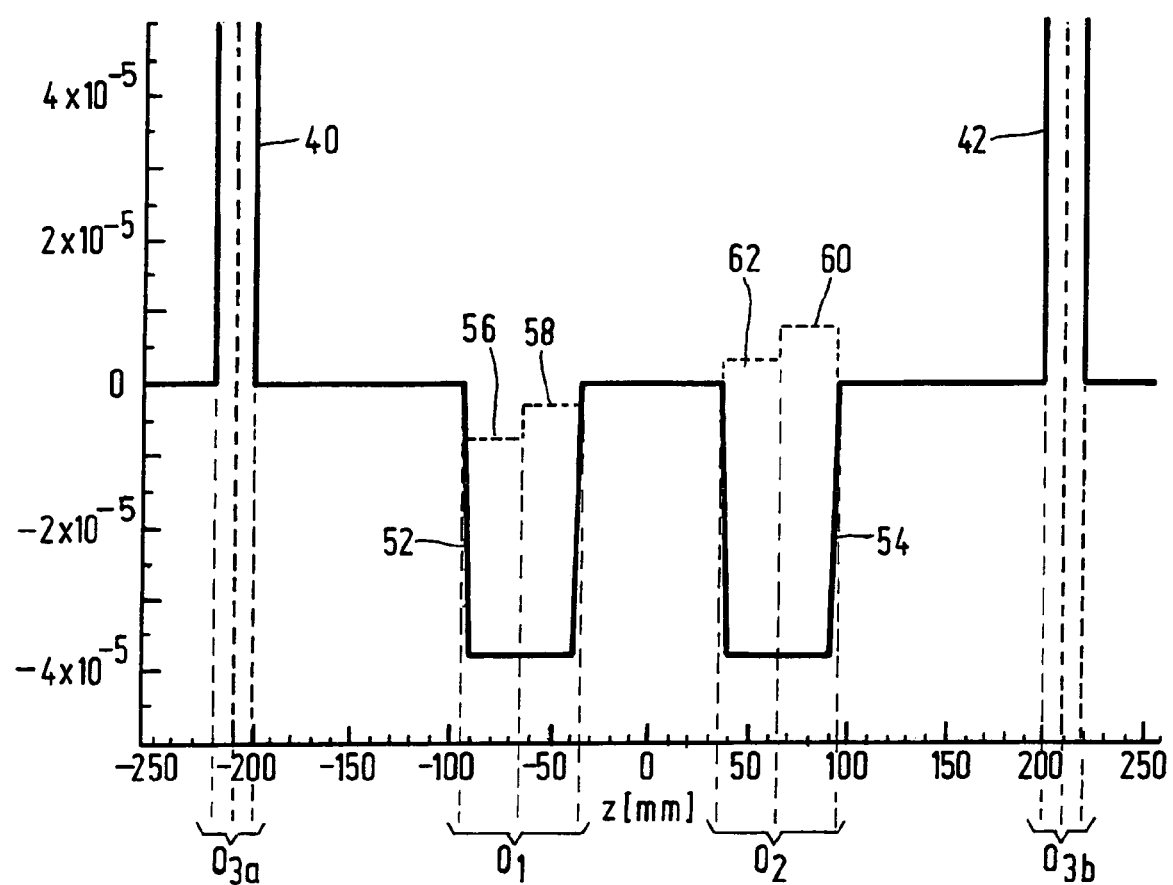
FIG. 3b is the same figure as FIG. 3a, but with a different scale on the vertical axis.

FIGS. 3a and 3b depict the distribution of the magnetostatic field that thus arises on the z-axis. FIG. 3b represents the same field distribution as that in FIG. 3a, whereby the vertical scale of FIG. 3b is stretched by a factor of the order of magnitude of 40 w.r.t. that of FIG. 3a; as a result of this, the details of the field distribution in the vicinity of z=−45 mm to z=−100 mm and of z=+45 mm to z=+100 mm are more clearly visible.

FIG. 3a depicts in more detail the field distributions on the z-axis of the octupoles $O_{3a}$ and $O_{3b}$; in addition, the axial field of the octupoles $O_1$ and $O_2$ is schematically depicted therein. The axial field of the even portion of octupole $O_{3a}$ ($O_{3b}$) is depicted herein by the solid line 40 (42), and the axial field of the uneven portion of octupole $O_{3a}$ ($O_{3b}$) is depicted herein by a dashed line. It should be pointed out that the even and the uneven portions of $O_{3a}$ and $O_{3b}$ in the z-direction are equally long. The uneven portions are divided into two equally long portions 44 (48) and 46 (50) in the z-direction. The excitations of the uneven portions, i.e. the field strengths on the z-axis, are now chosen in such a manner that both of the abovementioned conditions are satisfied, i.e. 1) that the ratios of the field strengths 44 (48) and 46 (50) are such that the contribution of the uneven octupoles 44, 46 and 48, 50 to the third-order axial aberrations is equal to zero, and 2) that the total field strengths of the uneven octupoles 44, 46 and 48, 50, together with the uneven portions 56, 58 and 60, 62 of the octupoles $O_1$ and $O_2$ (see FIG. 3)—which uneven portions will be discussed later—are such that the anisotropic coma of the combination of the corrector and the objective is equal to zero.

Moreover, FIG. 3b depicts in more detail the field distributions on the z-axis of the octupoles $O_1$ and $O_2$. The axial field of the uneven portion of octupole $O_1$ ($O_2$) is depicted herein by the solid line 52 (54), and the axial field of the uneven portion of octupole $O_1$ ($O_2$) is depicted herein by a dashed line. It should be pointed out that the even and the uneven portions of $O_1$ and $O_2$ in the z-direction are equally long. The uneven portions are divided into two equally long portions 56 (60) and 58 (62) in the z-direction. The excitations of the uneven portions, i.e. the field strengths on the z-axis, are now chosen in such a manner that both of the abovementioned conditions are satisfied, i.e. 1) that the ratios of the field strengths 56 (60) and 58 (62) are such that the contribution of the uneven octupoles 56, 58 and 60, 62 to the third-order axial aberrations is equal to zero, and 2) that the total field strengths of the uneven octupoles 56, 58 and 60, 62, together with the uneven portions of the octupoles $O_{3a}$ and $O_{3b}$, are such that the anisotropic coma in the combination of the corrector and the objective is equal to zero.

For a system corrected for the anisotropic coma in this manner, the aberrations of the combination of the corrector and the objective lens are indicated in the following Table 2. The values and data already set forth with regard to the description of FIG. 2a are applicable in this case. In Table 2, the aberrations in rows 1 to 5 are indicated using the symbols according to the abovementioned article by Haider et al. The letter i in Table 2 indicates the imaginary unit.

| # | | |
|---|---|---|
| 1 | $C_3, S_3, A_3$ (mm) | 0 |
| 2 | $C_5$ (mm) | −0.32 |
| 3 | $S_5$ (mm) | 0.11 i |
| 4 | $D_5$ (mm) | 0 |
| 5 | $A_5$ (mm) | 0.32 i |
| 6 | $S_{80}$ (mm) | 5 |
| 7 | $S_{62}$ (mm) | −9 |
| 8 | $S_{44}$ (mm) | −30 |
| 9 | $S_{26}$ (mm) | 35 |
| 10 | $S_{08}$ (mm) | −5 |
| 11 | $S_{x30} = S_{x12}$ | 0 |
| 12 | $S_{y21} = S_{y03}$ | 0 |
| 13 | $i F_{an}$ | 0 |
| 14 | $S_{x50}$ | 8 |
| 15 | $S_{x32}$ | −41 |
| 16 | $S_{x14}$ | 3 |
| 17 | $S_{y41}$ | −8 |
| 18 | $S_{y23}$ | 42 |
| 19 | $S_{y05}$ | −3 |
| 20 | $|S_{x41}|, \ldots |S_{y50}|$ | ≦5 |
| 21 | $C_{cx}, C_{cy}$ (mm) | 0 |
| 22 | $C_{cex}$ (mm) | 7 |
| 23 | $C_{ccy}$ (mm) | 17 |
| 24 | $C_{cmx}$ | −3.0 |
| 25 | $C_{cmy}$ | 3.0 |
| 26 | $C_{3c}$ (mm) | 13 |
| 27 | $S_{3c}$ (mm) | −1.9-0.5 i |
| 28 | $A_{3c}$ (mm) | 4.9 |

In Table 2 above, row 13 is of particular importance, from which it transpires that the anisotropic coma has indeed been made exactly equal to zero. Compare herewith the corresponding value in row 13 of Table 1, in which no correction was made for the anisotropic coma.

It is true that the aberration coefficients $S_5$ and $A_5$ indicated in rows 3 and 5 are no longer equal to zero in this embodiment, but their value is still so small as to be negligible.

Figure 4:
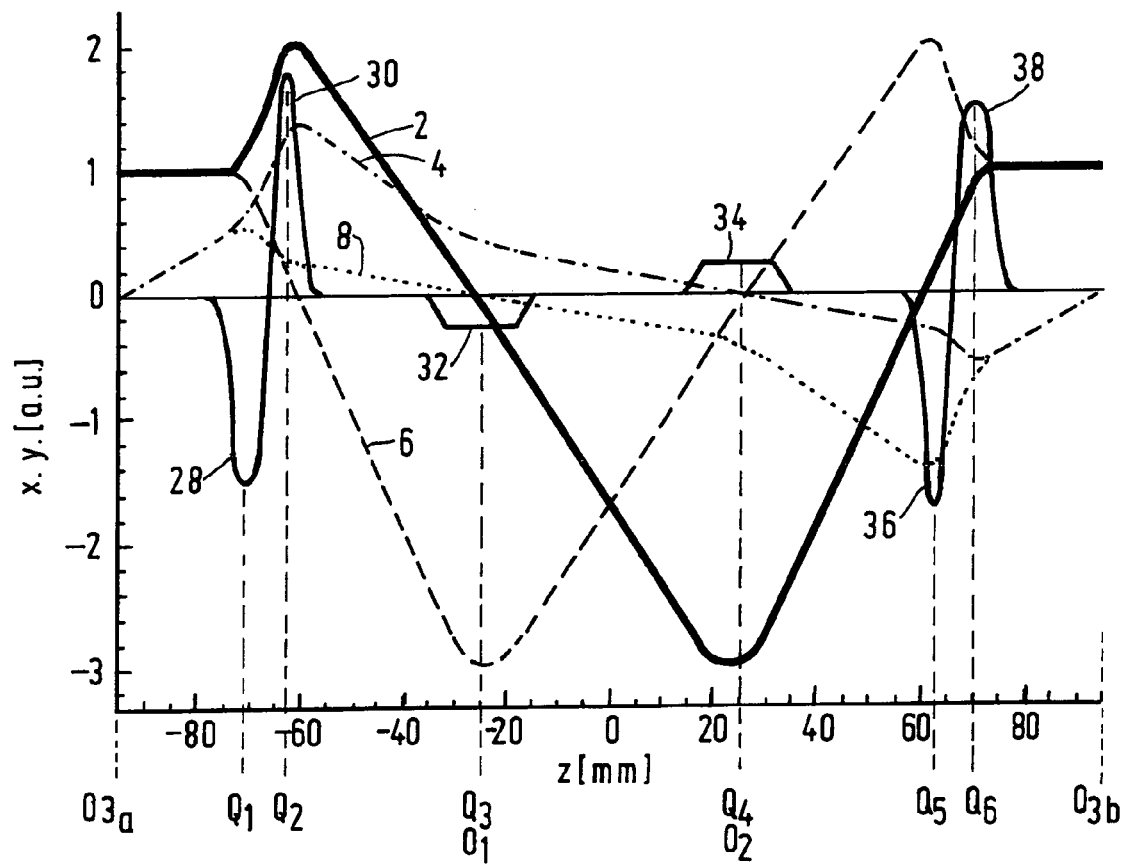
FIG. 4 illustrates the course of field rays $x_f(z)$ and $y_f(z)$ and axial rays $x_a(z)$ and $y_a(z)$ in the x-z plane and the y-z plane in the case of a corrector according to the invention, with the correct locations of the quadrupoles and octupoles with a thickness not equal to zero, specifically for application in a SEM or a low-voltage TEM.

FIG. 4 relates to the course of rays in a corrector according to the invention for use in a SEM or a low-voltage TEM. In this figure, the course of axial rays 2 and 6 and of field rays 4 and 8 is depicted in the x-z plane and the y-z plane of the corrector. The design of the corrector used hereby was obtained according to the above-mentioned paragraph "The steps in the design process for TEM, STEM and SEM", whereby the passages for SEM and low-voltage TEM are of particular importance. In this FIG. 4, the locations on the optical axis (the z-axis) of the six quadrupoles $Q_1$ to $Q_6$ are depicted, as are the locations on the z-axis of both octupoles $O_1$ and $O_2$, and the locations of the portions $O_{3a}$ and $O_{3b}$ of the third octupole that has been divided into two equal portions. Moreover, using the reference numerals 28, 30, 32, 34, 36 and 38, the excitation of the quadrupoles $Q_1$, $Q_2$, $Q_3$, $Q_4$, $Q_5$ and $Q_6$ is indicated in the form of the strength of the field on the optical axis. The plane of mirror symmetry is located at position z=0. The following values and data pertain to this design:

All quadrupoles are embodied to be electromagnetic.

The quadrupoles $Q_1$ and $Q_6$ are of themselves exactly achromatic.

The quadrupoles $Q_2$ and $Q_5$ deviate so little from the exact achromatic state that the condition $C_{cmx}=C_{cmy}=0$ is satisfied.

The quadrupoles $Q_3$ and $Q_4$ are (negatively) chromatic in such a manner that, as a result, the (positive) chromatic aberration of the objective is corrected.

At the locations of the quadrupoles $Q_1$, $Q_2$, $Q_5$ and $Q_6$, magnetic octupoles of relatively low optical power have been added; these octupoles correct inter alia the intrinsic third-order aberrations of the associated quadrupoles.

The portions $O_{3a}$ and $O_{3b}$ of the third octupole that has been divided into two equal portions are imaged onto the coma-free plane of the objective lens using a transfer lens system.

The acceleration voltage of the electrons is 10 kV.

The focal length of the objective lens to be corrected is 1.49 mm.

$C_c$ of the objective lens: 1.17 mm.

$C_s$ of the objective lens: 1.64 mm.

Internal radius of the multipoles: 3 mm.

Length of the quadrupoles $Q_3$ and $Q_4$: 17 mm.

Length of the octupole portions $O_{3a}$ and $O_{3b}$: 8 mm.

Magnification of the transfer lens system: 0.764 (as a result of which the beam diameter at the entrance to the objective is 0.764 times as large as in the exit plane of the corrector).

The aberrations of the combination of the corrector and the objective lens are indicated in the following table 3. In the situation set forth, the quadrupole lens in the transfer lens system (QFL) is turned off.

| # | | |
|---|---|---|
| 1 | $C_3, S_3, A_3$ (mm) | 0 |
| 2 | $C_5$ (mm) | −0.47 |
| 3 | $S_5$ (mm) | 0 |
| 4 | $D_5$ (mm) | 0 |
| 5 | $A_5$ (mm) | 0 |
| 6 | $S_{80}$ (mm) | 28 |
| 7 | $S_{62}$ (mm) | −70 |
| 8 | $S_{44}$ (mm) | −210 |
| 9 | $S_{26}$ (mm) | −42 |
| 10 | $S_{08}$ (mm) | 14 |
| 11 | $S_{x30} = S_{x12}$ | 0 |
| 12 | $S_{y21} = S_{y03}$ | 0 |
| 13 | $S_{x50}$ | 30 |
| 14 | $S_{x32}$ | −77 |
| 15 | $S_{x14}$ | −72 |
| 16 | $S_{y41}$ | −75 |
| 17 | $S_{y23}$ | −28 |
| 18 | $S_{y05}$ | 13 |
| 19 | $C_{cx}, C_{cy}$ (mm) | 0 |
| 20 | $C_{cex}$ (mm) | −2.2 |
| 21 | $C_{ccy}$ (mm) | −2.2 |
| 22 | $C_{cmx}$ | 0 |
| 23 | $C_{cmy}$ | 0 |
| 24 | $C_{3c}$ (mm) | 0 |
| 25 | $S_{3c}$ (mm) | 0 |
| 26 | $A_{3c}$ (mm) | 0 |

In Table 3 above, the aberrations in rows 1 to 5 are indicated using the symbols according to the abovementioned article by M. Haider et al. In rows 6 to 10, the seventh-order aberration coefficients are indicated; as transpires from the values concerned, these are of the order of magnitude of a few centimeters at most. Rows 11 and 12 indicate the coefficients of the isotropic coma. Rows 13 to 18 indicate the coefficients of the fifth-order coma; from the values concerned, it is evident that this group of lens errors is negligible. In row 19, it transpires that the coefficients of the chromatic aberration in both the x-z plane ($C_{cx}$) and the y-z plane ($C_{cy}$) have become exactly equal to zero. In rows 20 and 21, it transpires that the coefficients of the axial chromatic error of degree two $C_{cc}$ in the x-z plane ($C_{ccx}$) and the y-z plane ($C_{ccy}$), respectively, have been made very small. In rows 23 to 26, it transpires that the coefficients of the chromatic magnification error ($C_{cm}$) in the x-z plane ($C_{cmx}$) and the y-z plane ($C_{cmy}$), respectively, and the mixed aberrations $A_{3c}$, $C_{3c}$ and $S_{3c}$ of the third order and the first degree, have been made equal to zero.

FIG. 5a renders a schematic depiction of the positioning of the corrector according to the invention in a TEM. The beam of electrons thereby successively traverses a condenser system 10, a sample 12 to be investigated in the TEM, an objective lens 14, a transfer lens system 16 consisting of two transfer lenses 18 and 20, an aberration corrector 22 according to the invention, a further lens 24, and a projector system 26. The aberration corrector 22 is bordered by two portions $O_{3a}$ and $O_{3b}$ of the third octupole.

FIG. 5b renders a schematic depiction of the positioning of the corrector according to the invention in a SEM or a STEM. The beam of electrons thereby successively traverses a condenser system 10, an intermediate lens 28, an aberration corrector 22 according to the invention, a transfer lens system 16 consisting of two transfer lenses 18 and 20, a probe-forming objective lens 14, and a sample 12 to be investigated in the SEM or the STEM. The aberration corrector 22 is bordered by two portions $O_{3a}$ and $O_{3b}$ of the third octupole.

The invention claimed is:

1. A particle-optical appliance provided with an objective lens and with aberration-correcting means for correcting lens errors of the objective lens, which aberration-correcting means comprise:

a first group of optical elements, consecutively consisting of a first, a second and a third quadrupole lens and a first octupole;

a second group of optical elements, consecutively consisting of a second octupole and a fourth, a fifth and a sixth quadrupole lens; and at least one third octupole, placed outside both groups of optical elements, whereby the first and the second octupole and the third and the fourth quadrupole lens are placed between the first and the second quadrupole on the one hand and the fifth and the sixth quadrupole on the other hand, in which the quadrupole lenses determine the paths of electrically charged particles in the aberration-correcting means in such a manner as to cause imaging of octupoles upon one another, characterized in that in a first axial plane, the first and the second octupole are not imaged upon one another, and the second and the third octupole are imaged upon one another;

in a second axial plane perpendicular to the first axial plane, the first and the second octupole are not imaged upon one another, and the first and the third octupole are imaged upon one another; and an axial beam in the first axial plane passes through the axial point of the first octupole and in the second axial plane passes through the axial point of the second octupole, as a result of which third-order lens errors are corrected, and fifth-order lens errors are, at the least, minimized.

2. A particle-optical apparatus according to claim 1, wherein the quadrupole field of the third quadrupole lens and the octupole field of the first octupole overlap one another at least partially, and the quadrupole field of the fourth quadrupole lens and the octupole field of the second octupole overlap one another at least partially.

3. A particle-optical apparatus according to claim 1, wherein the third octupole is located at that side of the aberration-correcting means at which the objective lens that is to be corrected in the particle-optical appliance is not located.

4. A particle-optical apparatus according to claim 1, wherein the third octupole is divided into a first portion and an equal second portion by a cross-section perpendicular to the optical axis, which portions are respectively located on opposite sides of both groups of optical elements, and wherein a plane of mirror symmetry perpendicular to the optical axis is present in such a manner that, when mirrored with respect to said symmetry plane, the positions of the three quadrupoles and the octupole of the first group, and the first portion of the third octupole, yield the locations of the three quadrupoles and the octupole of the second group, and of the second portion of the third octupole, whereby the excitations of the quadrupoles of the first group are opposite to those of the corresponding quadnipoles of the second group.

5. A particle-optical apparatus according to claim 1, wherein the third and the forth quadrupole lens are each embodied as a combination of magnetostatic and electrostatic quadrupoles.

6. A particle-optical apparatus according to claim 5, wherein a further quadrupole lens from the first group of optical elements and a further quadrupole lens from the second group of optical elements are each embodied as a combination of a magnetostatic and an electrostatic quadrupole.

7. A particle-optical apparatus according to claim 5, wherein a transfer lens system is placed between the aberration-correcting means and the objective to be corrected, which system causes the axial particle rays to pass through a point of intersection in the optical axis, at the location of which point of intersection a seventh quadrupole is placed.

8. A particle-optical apparatus according to claim 6, wherein the three quadrupole lenses from the first group of optical elements and the three quadrupole lenses from the second group of optical elements are all embodied as a combination of magnetostatic and electrostatic quadrupoles, and wherein the first, the second, the fifth and the sixth quadrupole are also embodied to be achromatic.

9. A particle-optical apparatus according to claim 1, wherein at least three further octupoles are added, which are placed at the locations of the first, the second and the third octupole, respectively, which first, second and third octupoles are even octupoles and which first, second and third further octupoles are uneven octupoles, each of which uneven octupoles, as a result of a cross-section perpendicular to the optical axis, consists of a first and a second portion, in which the ratio of the excitations of the first and the second portion of each uneven octupole is such that the contribution of the uneven octupoles to the third-order axial aberrations is equal to zero, and in which the total excitation of all uneven octupoles is such that the anisotropic coma of the combination of the aberration-correcting means and the objective lens to be corrected is equal to zero.

10. A particle-optical apparatus according to claim 2, wherein the third octupole is located at that side of the aberration-correcting means at which the objective lens that is to be corrected in the particle-optical appliance is not located.

11. A particle-optical apparatus according to claim 2:
wherein the third octupole is divided into a first portion and an equal second portion by a cross-section perpendicular to the optical axis, which portions are respectively located on opposite sides of both groups of optical elements; and
a plane of mirror symmetry perpendicular to the optical axis is present in such a manner that, when mirrored with respect to said symmetry plane, the positions of the three quadrupoles and the octupole of the first group, and the first portion of the third octupole, yield the locations of the three quadrupoles and the octupole of the second group, and of the second portion of the third octupole, whereby the excitations of the quadrupoles of the first group are opposite to those of the corresponding quadrupoles of the second group.

12. A particle-optical apparatus according to claim 2, wherein the third and the forth quadrupole lens are each embodied as a combination of magnetostatic and electrostatic quadrupoles.

13. A particle-optical apparatus according to claim 3, wherein the third and the forth quadrupole lens are each embodied as a combination of magnetostatic and electrostatic quadrupoles.

14. A particle-optical apparatus according to claim 4, wherein the third and the forth quadrupole lens are each embodied as a combination of magnetostatic and electrostatic quadrupoles.

15. A particle-optical apparatus according to claim 10, wherein the third and the forth quadrupole lens are each embodied as a combination of magnetostatic and electrostatic quadrupoles.

16. A particle-optical apparatus according to claim 11, wherein the third and the forth quadrupole lens are each embodied as a combination of magnetostatic and electrostatic quadrupoles.

17. A particle-optical apparatus according to claim 12, wherein a further quadrupole lens from the first group of optical elements and a further quadrupole lens from the second group of optical elements are each embodied as a combination of a magnetostatic and an electrostatic quadrupole.

18. A particle-optical apparatus according to claim 13, wherein a further quadrupole lens from the first group of optical elements and a further quadrupole lens from the second group of optical elements are each embodied as a combination of a magneto static and an electrostatic quadrupole.

19. A particle-optical apparatus according to claim 14, wherein a further quadrupole lens from the first group of optical elements and a further quadrupole lens from the second group of optical elements are each embodied as a combination of a magnetostatic and an electrostatic quadrupole.

20. A particle-optical apparatus according to claim 12, wherein a transfer lens system is placed between the aberration-correcting means and the objective to be corrected, which system causes the axial particle rays to pass through a point of intersection in the optical axis, at the location of which point of intersection a seventh quadrupole is placed.

21. A particle-optical apparatus according to claim 13, wherein a transfer lens system is placed between the aberration-correcting means and the objective to be corrected, which system causes the axial particle rays to pass through a point of intersection in the optical axis, at the location of which point of intersection a seventh quadrupole is placed.

22. A particle-optical apparatus according to claim 14, wherein a transfer lens system is placed between the aberration-correcting means and the objective to be corrected, which system causes the axial particle rays to pass through a point of intersection in the optical axis, at the location of which point of intersection a seventh quadrupole is placed.

23. A particle-optical apparatus according to claim 17, wherein the three quadrupole lenses from the first group of optical elements and the three quadrupole lenses from the second group of optical elements are all embodied as a combination of magnetostatic and electrostatic quadrupoles, and wherein the first, the second, the fifth and the sixth quadrupole are also embodied to be achromatic.

24. A particle-optical apparatus according to claim 18, wherein the three quadrupole lenses from the first group of optical elements and the three quadrupole lenses from the second group of optical elements are all embodied as a combination of magnetostatic and electrostatic quadrupoles, and wherein the first, the second, the fifth and the sixth quadrupole are also embodied to be achromatic.

25. A particle-optical apparatus according to claim 19, wherein the three quadrupole lenses from the first group of optical elements and the three quadrupole lenses from the second group of optical elements are all embodied as a combination of magnetostatic and electrostatic quadrupoles, and wherein the first, the second, the fifth and the sixth quadrupole are also embodied to be achromatic.

* * * * *